United States Patent
Coyle, Jr. et al.

(10) Patent No.: US 8,113,853 B2
(45) Date of Patent: Feb. 14, 2012

(54) JUNCTION BOX FOR PHOTOVOLTAIC SYSTEMS

(75) Inventors: William J. Coyle, Jr., Toms River, NJ (US); Vincent Giglio, Toms River, NJ (US); Michael Jerome, Toms River, NJ (US); Thomas A. Jerome, Barnegat, NJ (US)

(73) Assignee: Heyco, Inc., Toms River, NJ (US)

( * ) Notice: Subject to any disclaimer, the term of this patent is extended or adjusted under 35 U.S.C. 154(b) by 135 days.

(21) Appl. No.: 12/548,740

(22) Filed: Aug. 27, 2009

(65) Prior Publication Data

US 2010/0218797 A1   Sep. 2, 2010

Related U.S. Application Data

(60) Provisional application No. 61/092,840, filed on Aug. 29, 2008.

(51) Int. Cl.
*H01R 12/00* (2006.01)
(52) U.S. Cl. ....................................... 439/76.1; 439/482
(58) Field of Classification Search .................. 439/485, 439/487, 76.1, 76.2, 110, 114–116, 212–213
See application file for complete search history.

(56) References Cited

U.S. PATENT DOCUMENTS

| 4,460,232 | A | 7/1984 | Sotolongo |
| 6,344,612 | B1 | 2/2002 | Kuwahara et al. |
| 6,369,315 | B1 | 4/2002 | Mizukami et al. |
| 6,655,987 | B2 | 12/2003 | Higashikozono et al. |
| 7,134,883 | B2 | 11/2006 | Werner et al. |
| 7,291,036 | B1 | 11/2007 | Daily et al. |
| 7,365,965 | B2 | 4/2008 | Higashikozono et al. |
| 2003/0193322 | A1 | 10/2003 | Higashikozono et al. |
| 2005/0161080 | A1 | 7/2005 | Nieleck et al. |

(Continued)

FOREIGN PATENT DOCUMENTS
EP 0 999 601 A1 5/2000

OTHER PUBLICATIONS

Solarlok Interconnection System, Tyco Electronics Corporation, © 2007 (36 pages).
International Search Report dated Apr. 20, 2010 issued in connection with Applicant's International Patent Application No. PCT/US2009/055154 (6 pages).

(Continued)

*Primary Examiner* — Khiem Nguyen
(74) *Attorney, Agent, or Firm* — Greenberg Traurig, LLP (57) ABSTRACT

A junction box for a photovoltaic system includes a housing having a base and a cover removably attached thereto, and a plurality of guide channels extending from an exterior surface of the housing to an interior portion thereof. The guide channels are sized and shaped to receive a plurality of conductive foil strips from a solar panel array. When the strips are fed into the guide channels, they are guided to and properly positioned within corresponding receptacles. Each receptacle is sized and shaped to receive a buss bar, and each strip is connected to a corresponding buss bar by a low insertion connector. When the cover is fully engaged with the base, bosses extending from the cover press against the connectors, creating a spring tension and pinch and retain the associated strip. As a result, a reliable physical and electrical connection between the strips and the buss bars is achieved. A heat sink having a plurality of fins protrude outwardly from the housing to dissipate heat externally.

14 Claims, 8 Drawing Sheets

U.S. PATENT DOCUMENTS

| | | |
|---|---|---|
| 2005/0230140 A1 | 10/2005 | Higashikozono et al. |
| 2005/0236031 A1 | 10/2005 | Higashikozono et al. |
| 2006/0180196 A1 | 8/2006 | Lares et al. |
| 2007/0249189 A1 | 10/2007 | Kaneko et al. |
| 2008/0110490 A1 | 5/2008 | Duesterhoeft |
| 2008/0149385 A1 | 6/2008 | Kanamaru et al. |
| 2009/0275231 A1 | 11/2009 | Richter |

OTHER PUBLICATIONS

Written Opinion dated Apr. 20, 2010 issued in connection with Applicant's International Patent Application No. PCT/US2009/055154 (8 pages).

JUNCTION BOX FOR PHOTOVOLTAIC SYSTEMS

CROSS-REFERENCE TO RELATED APPLICATION

This application is a Section 111(a) application relating to commonly owned, U.S. Provisional Application Ser. No. 61/092,840 entitled "JUNCTION BOX FOR PHOTOVOLTAIC SYSTEMS" filed Aug. 29, 2008.

FIELD OF THE INVENTION

The present invention relates to an electrical junction box and, more particularly, an electrical junction box for use in connection with photovoltaic systems.

BACKGROUND OF THE INVENTION

There is a growing need for renewable energy sources, with solar energy being at the forefront. As a result, the use of photovoltaic systems has increased exponentially in recent years. An electrical junction box is an integral part of a photovoltaic system, as it provides electrical connections between individual solar panels (i.e., photovoltaic modules) of a solar array and between the solar panels to other system components (e.g., a DC/AC inverter, etc.). Consequently, the reliability of the junction box is crucial for maintaining a dependable and efficient photovoltaic system. Current junction boxes, however, are complex in construction and installing them can be laborious. In addition, current junction boxes do not provide reliable electrical connections and their durability is low. What is needed, therefore, is a junction box that is simple in construction and easily installable, yet maintains a reliable electrical connection between the components of a photovoltaic system, and is durable enough to withstand a wide range of environmental conditions.

SUMMARY OF THE INVENTION

The present invention overcomes the disadvantages and shortcomings of the prior art discussed above by providing a junction box for a photovoltaic system that includes a housing having a base and a cover removably attached thereto. A plurality of guide channels extend from an exterior surface of the housing to an interior portion thereof. The guide channels are sized and shaped to receive a plurality of conductive foil strips from a solar panel array. When the foil strips are fed into the guide channels, they are guided to and properly positioned within corresponding receptacles. Each receptacle is sized and shaped to receive a buss bar. Each foil strip is connected to a corresponding buss bar by a low insertion connector. When the cover is fully engaged with the base, bosses extending from the cover press against the connectors, creating a spring tension, which, in turn, pinches and retains the associated foil strip. As a result, a reliable physical and electrical connection between the foil strips and the buss bars is achieved.

The junction box further includes a heat sink having a plurality of fins that protrude outwardly from the housing. Accordingly, heat is dissipated external of the housing.

Specifically, the present invention has been adapted for use in connection with photovoltaic systems. However, the present invention can be utilized in connection with other power generating systems. Further features and advantages of the invention will appear more clearly on a reading of the following detailed description of an exemplary embodiment of the invention.

BRIEF DESCRIPTION OF THE DRAWINGS

Reference is made to the following detailed description of the exemplary embodiment considered in conjunction with the accompanying drawings, in which.

DETAILED DESCRIPTION OF THE EXEMPLARY EMBODIMENTS

Figure 1:
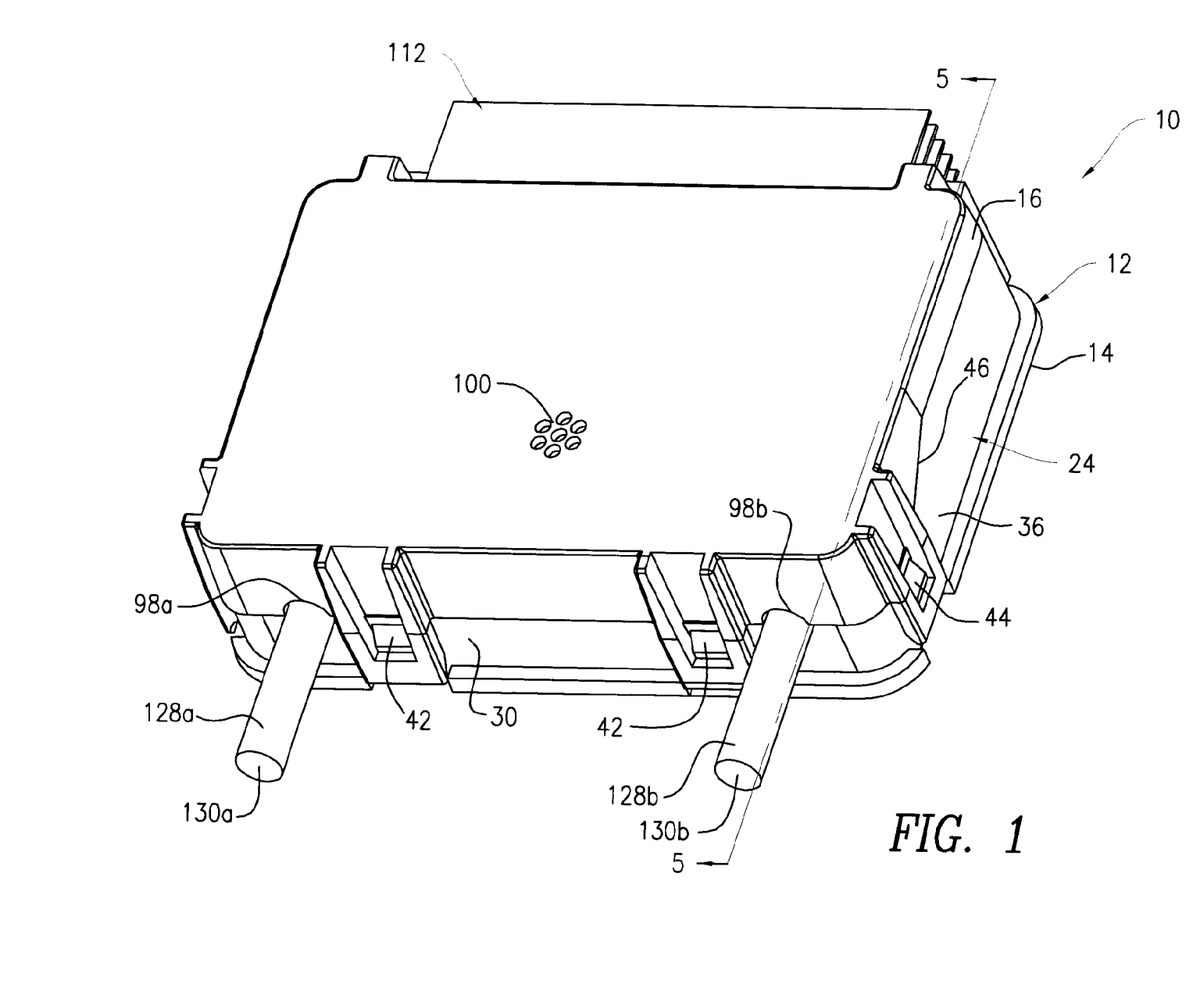
FIG. 1 is a top perspective view of a junction box constructed in accordance with an exemplary embodiment of the present invention.
Figure 2:
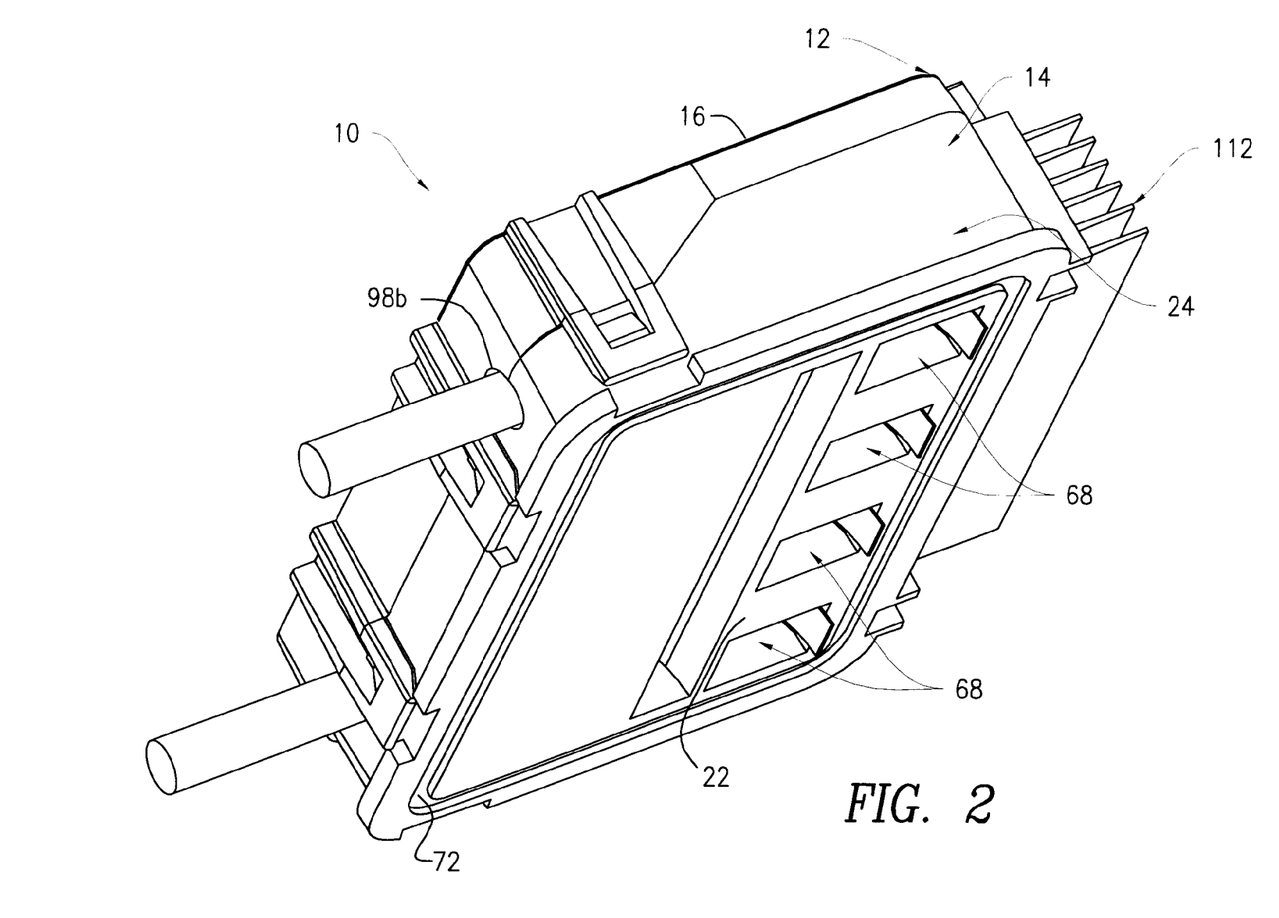
FIG. 2 is a bottom perspective view of the junction box shown in FIG. 1.

Referring to FIGS. 1 and 2, an electrical junction box 10 includes a rectangular-shaped housing 12 having a base 14 and a cover 16 attached removably to the base 14. The base 14 and the cover 16 are separate and distinct components, but they may be of unitary construction. The housing 12 is manufactured from a thermoplastic polymer, such as polycarbonate. However, the housing 12 may be manufactured from any other suitable materials known in the art, especially materials having electrical insulating properties. Although the housing 12 is rectangular in shape, it may consist of other shapes and sizes (e.g., square, oblong, circular, elliptical, etc.) in order to accommodate a variety of applications.

Figure 3:
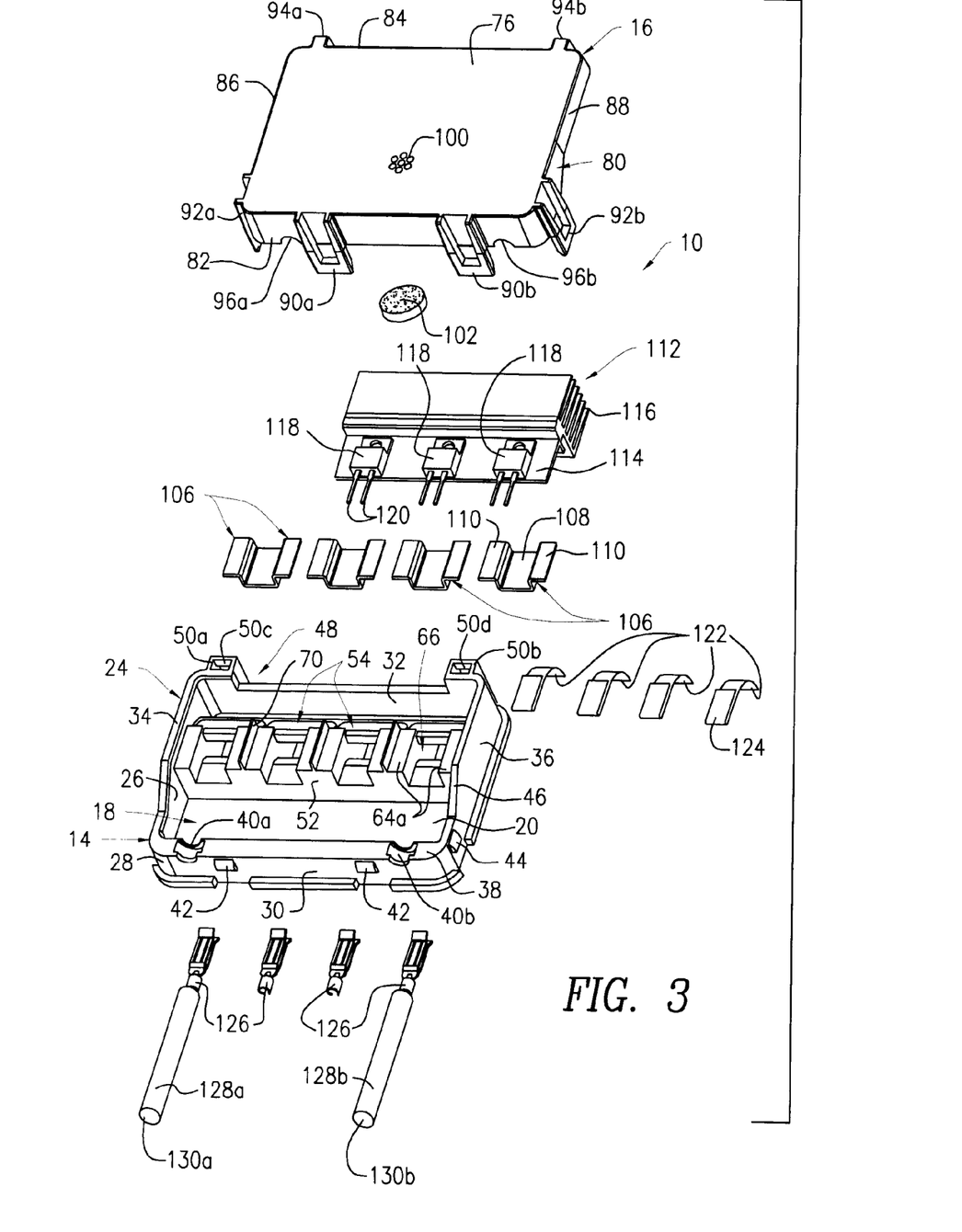
FIG. 3 is an exploded perspective view, looking from above, of the junction box shown in FIG. 1.

Referring to FIGS. 2 and 3, the base 14 includes a floor 18 having an interior surface 20 and an exterior surface 22 opposite thereof, and a wall 24 that extends outwardly from the floor 18 and around the perimeter thereof. The wall 24 has an interior surface 26 and exterior surface 28 opposite thereof, and includes front and rear walls 30, 32 positioned opposite and parallel to one another and a pair of sidewalls 34, 36 that extend between the front and rear walls 30, 32 and parallel to one another. With particular reference to FIG. 3, a top surface 38 of the front wall 30 includes a pair of semi-circular shaped notches 40a, 40b that are spaced apart from one another and extend from the exterior surface 28 to the interior surface 26 of the front wall 30. The purpose of the notches 40a, 40b shall be explained in greater detail below.

Referring to FIGS. 1 and 3, the exterior surface 28 of the front wall 30 includes a pair of locking tabs 42 extending outwardly therefrom, while the exterior surfaces 28 of the sidewalls 34, 36 includes a locking tab 44 (the locking tab on the sidewall 34 is not shown in the Figures). The functions of the locking tabs 42 and the locking tabs 44 shall be explained in greater detail below. Each of the sidewalls 34, 36 include a sloped portion 46, whose purpose shall be explained below. An elongated, rectangular-shaped recess 48 is formed in the rear wall 32 and extends from the interior surface 26 to the exterior surface 28 thereof. The recess 48 is flanked by a pair of rectangular-shaped posts 50a, 50b that extend upwardly from the floor 18 and are positioned adjacent to the rear wall 32. Each of the posts 50a, 50b includes a rectangular-shaped aperture 50c, 50d, respectively. The purposes and functions of the recess 48 and the posts 50a, 50b shall be described hereinafter.

Figure 5:
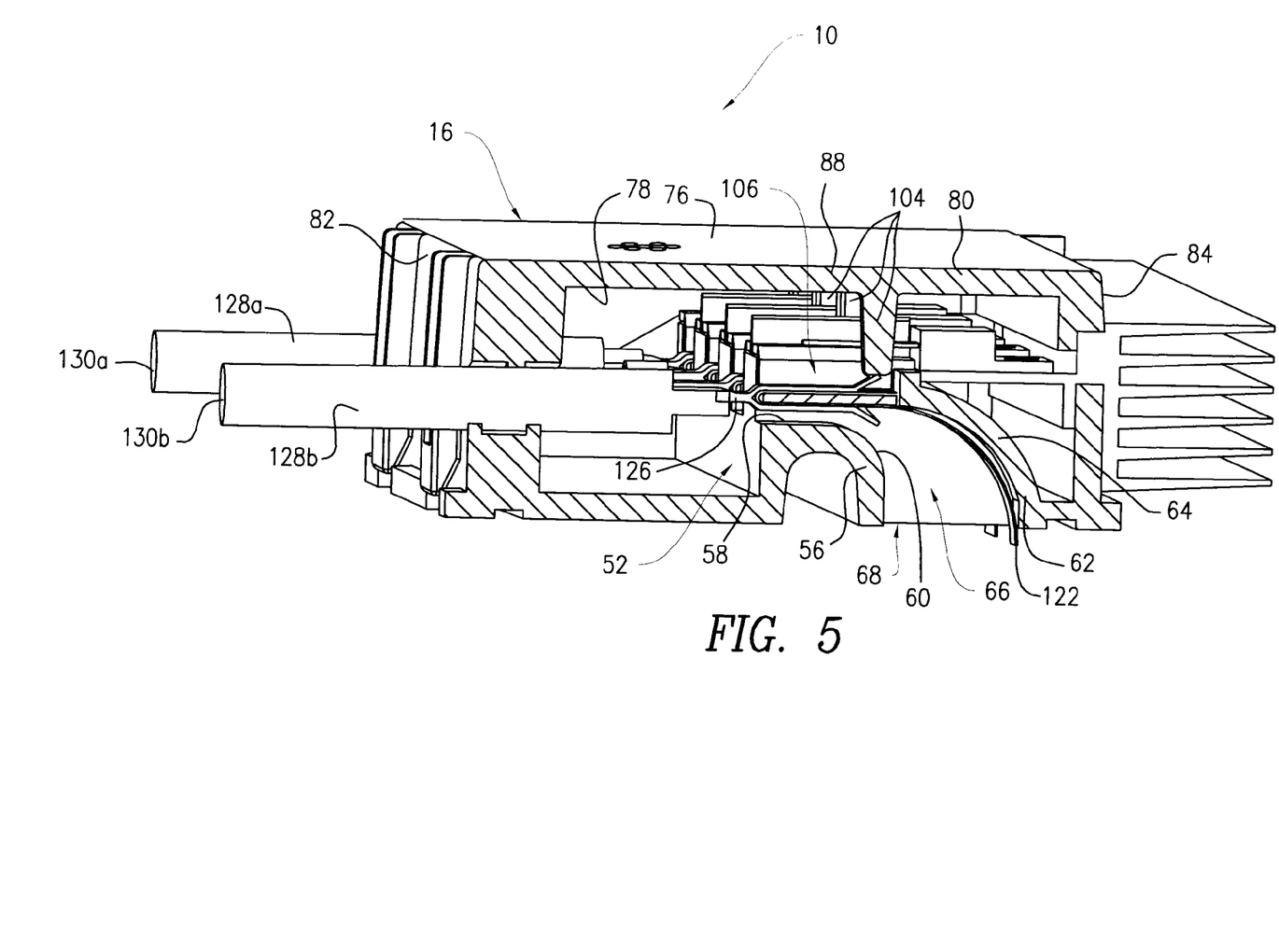
FIG. 5 is a is a cross-sectional view, taken along section line 5-5 and looking in the direction of the arrows, of the junction box shown in FIG. 1.

Referring to FIGS. 3 and 5, the base 14 includes an integral terminal block 52 having a plurality of rectangular-shaped receptacles 54 aligned linearly and spaced apart from one another. While the junction box 10 has the four receptacles 54, it can include greater or less than four. With particular reference to FIG. 5, each receptacle 54 includes a first wall 56 that transitions from a flat portion 58, which is positioned proximate to the interior surface 20 of the floor 18, to a convex portion 60 that extends to the exterior surface 22 of the floor 18 (see FIG. 5). Each of the receptacles 54 further includes a second wall 62 having a concave surface 64 and which is spaced apart from the first wall 56. With reference to FIG. 3, each of the receptacles 54 includes a pair of shoulders 64a, which together with the first and second walls 56, 62 form a guide channel 66. The guide channel 66 terminates at a corresponding rectangular-shaped aperture 68 at the exterior surface 22 of the floor 18 (not shown in FIGS. 3 and 5, but see FIG. 2). Each of the innermost positioned shoulders 64a (i.e., those not adjacent the sidewalls 34, 36) includes a rectangular-shaped partition 70 that extends upwardly therefrom. The purpose and function of the partitions 70 shall be described hereinafter.

Referring briefly to FIG. 2, the outer surface of the floor 18 includes a rectangular-shaped groove 72 formed around the perimeter thereof. The purpose and function of the groove 72 shall be explained below. Alternatively, the groove 72 need not be included.

Referring back to FIGS. 3 and 5, the cover 16 includes an exterior surface 76 and an interior surface 78 opposite thereof and a wall 80 that extends outwardly from the interior surface 78 and around the perimeter thereof. The wall 80 includes front and rear walls 82, 84 positioned opposite and parallel to one another and a pair of sidewalls 86, 88 that extend between the front and rear walls 82, 84 and parallel to one another. The cover 16 is sized and shaped to mate with the base 14. Along these lines, the cover 16 includes a pair of latch members 90a, 90b that extend from the front wall 82, a pair of latch members 92a, 92b that extend from respective sidewalls 86, 88, and a pair of hook members 94a, 94b that extend from a rear wall 84 and are spaced apart from one another. The hook members 94a, 94b are inserted within the apertures 50c, 50d, respectively, and hingedly engage the receiving posts 50a, 50b of the base 14 (not shown in the Figures). The front wall 82 includes a pair of spaced apart, semi-circular shaped notches 96a, 96b. When the cover 16 and the base 14 are fully engaged with one another, the latch members 90a, 90b interlock with the locking tabs 42 respectively, while the latch members 92a, 92b interlock with the locking tabs 44, respectively. In addition, when the cover 16 and the base 14 are fully engaged with one another, the notches 40a, 96a cooperate to form a circular shaped aperture 98a, while the notches 40b, 96b cooperate to form a circular shaped aperture 98b (not shown in FIGS. 3 and 5, but see FIGS. 1 and 2). The purpose and function of the apertures 98a, 98b shall be discussed below. A gasket may be introduced between the cover 16 and the base 14 to form a seal therebetween (not shown in the Figures) from external environmental conditions, such as weather and foreign particles.

Referring to FIGS. 1 and 3, a vent 100 is formed within the cover 16, extending from the exterior surface 76 to the interior surface 78 thereof. A filter 102 covers the vent 100 on the interior surface 78 of the cover 16. The filter 102 may be made of GOR-TEX® material, but it can be made of other suitable materials known in the art. The purpose and function of the vent 100 and the filter 102 shall be provided below.

Referring to FIG. 5, a plurality of bosses 104 extend outwardly from the interior surface 78 of the cover 16. The bosses 104 are arranged linearly and spaced apart from one another. The purpose and function of the bosses 104 shall be explained below.

Figure 4:
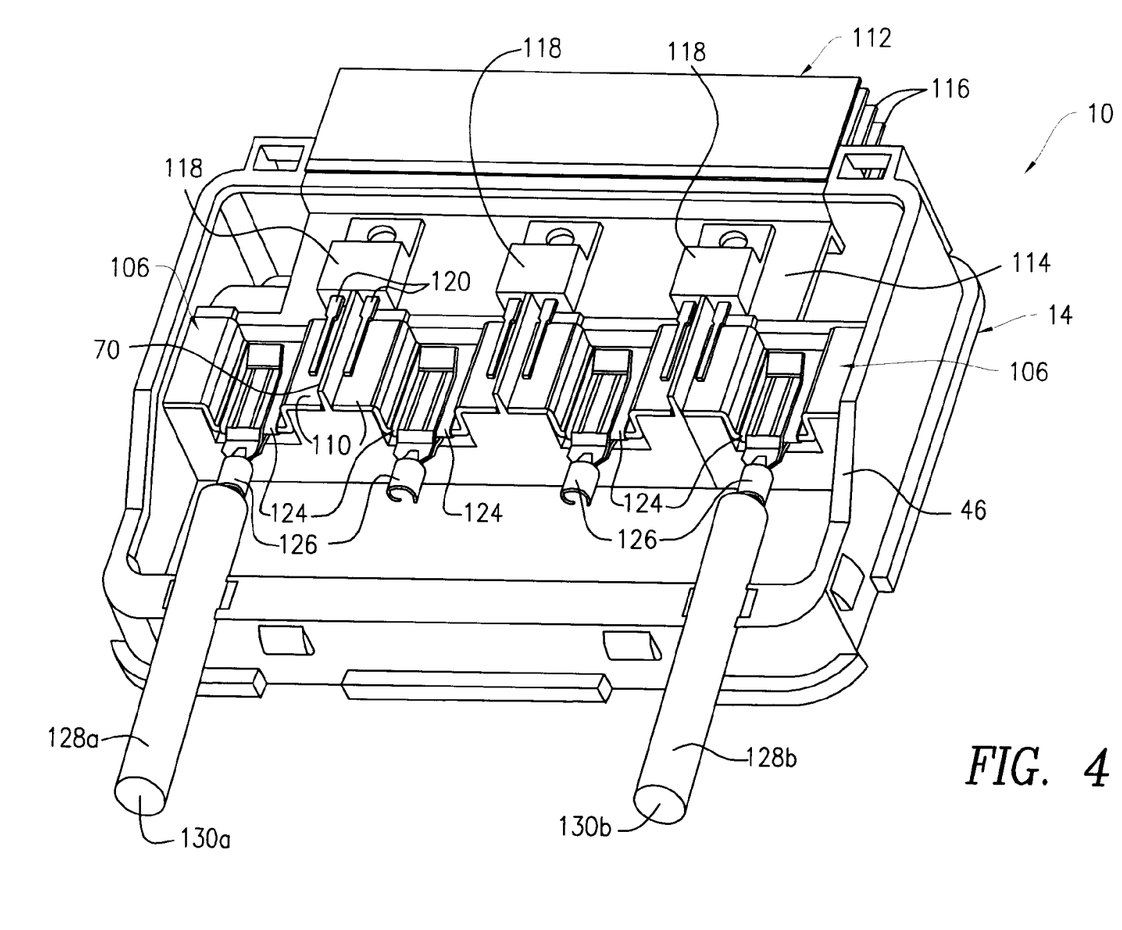
FIG. 4 is a top perspective view of the junction box shown in FIG. 1 with a cover employed by the junction box removed.

Referring to FIGS. 3 and 4, the junction box 10 includes a plurality of buss bars 106, each having a central portion 108 and a pair of arms 110 extending laterally therefrom. The buss bars 106 are made of tin-plated brass, but they can be made from other suitable conductive materials known in the art. Each buss bar 106 is positioned within a corresponding one of the receptacles 54 such the arms 110 rest on the shoulders 64a adjacent to the flat portion 58, respectively, while that the central portion 108 thereof sits above the flat portion 58. Each of the partitions 70 physically separates one of the arms 110 of one of the buss bars 106 from one of the arms 110 of another adjacently positioned buss bar 106.

Referring to FIGS. 3 and 5, the junction box 10 includes a heat sink 112 having a mounting portion 114 and a plurality of fins 116 extending therefrom and spaced apart from one another. The mounting portion 114 of the heat sink 112 is positioned within the recess 48 of the base 12, and is secured in place by the cover 16 when it is fully engaged with the base 12. In such position, the fins 116 of the heat sink 112 extend outwardly and externally from the base 14. The heat sink 112 is manufactured from anodized aluminum, but it can be made from other thermally conductive materials known in the art, such as, for example, copper.

Referring to FIG. 3, a plurality of diodes 118 are mounted linearly to the mounting portion 114 of the heat sink 112. The diodes 118 may be mounted to the heat sink by any sufficient means known in the art, such as, for instance, rivets or adhesives. Each of the diodes 118 includes a pair of leads 120. As shown in FIG. 4, one of the pair of leads 120 of one of the diodes 118 is attached (e.g., crimped, soldered, etc.) to one of the arms 110 of one of the buss bars 106, while the other of the pair of leads 120 of the diode 118 is attached to one of the arms 110 of another adjacent buss bar 106. As a result, each of the buss bars 106 are connected electrically with one another. The diodes 118 are TO220 pack diodes manufactured by Diotec Semiconductor AG of Germany, model number SBT1840. However, the diodes 118 can be made by other manufacturers and/or consist of any type of suitable diode or equivalent component.

Referring to FIGS. 3 and 5, the junction box 10 is adapted to receive one or more flexible foil strips 122 of a solar panel array (not shown in the Figures). The foil strips 122 conduct power from the solar panel array and typically protrude from the solar panel substrate (not shown in the Figures). Accordingly, the strips 122 are made from a flexible, conductive material, such as nickel plated copper, but they could be made from other conductive materials. A free end 124 of the foil strip 122 is fed into one of the apertures 68 on the exterior surface 22 of the floor 18, slides through and is guided within the guide channel 66, and exits the receptacle 54 between the central portion 108 of the buss bar 106 and the flat portion 58 of the receptacle 54. The guide channel 66 is sized and shaped to enable the foil strip 122 to be easily guided into position (i.e., between the central portion 108 of the buss bar 106 and the flat portion 58 of the receptacle 54). The free end 124 of the foil strip 122 is, preferably, folded over so that it wraps around the central portion 108 of the buss bar 106 and between the arms 110 thereof, thereby increasing the contact area. Each of the remaining foil strips 122 is connected to a corresponding one of the remaining buss bars 106 in an identical manner as described above (see also FIG. 2).

Referring to FIGS. 3 through 5, once the foil strips 122 are in position, low insertion female connectors 126 clip the foil strips 122 to the buss bars 106 to ensure a reliable physical and electrical connection between them. The connectors 126 are quickly and easily connected and disconnected to the buss bars 106. The connectors 126 consist of female cord connectors manufactured by Heyco Products, Inc. of Toms River, N.J., part number 1155/7279. The connectors 126 are made of tin-plated brass, but they can be made of other electrically conductive materials known in the art. As shown in the Figures, an electrical wire 128$a$ is connected to one of the connectors 126, while an electrical wire 128$b$ is connected to another one of the connectors 126. The apertures 98$a$, 98$b$ provide entry paths for the electrical wires 128$a$, 128$b$, respectively, into the interior of the housing 12. The remaining connectors 126 are utilized to maintain the physical and electrical connection between the associated foil strip 122 and buss bar 106. While the wires 128$a$, 128$b$ are positioned as shown, they may be attached to any of the connectors 126 as desired. It is also noted that the sloped portions 46 of the sidewalls 34, 36 of the base 14 provide better maneuverability by a user to connect and disconnect the connectors 126.

The electrical wires 128$a$, 128$b$ serve as the positive and negative connections, respectively, to and from the junction box 10. Along these lines, free ends 130$a$, 130$b$ of the wires 128$a$, 128$b$ may include male or female connectors for physical and electrical connection to, for example, a DC/AC power inverter, additional junction boxes 10, or extension cables (not shown in the Figures). For instance, the positive electrical wire 128$a$ of a first junction box 10 may be coupled to the negative electrical wire 128$b$ of a second junction box 10, while the negative electrical wire 128$a$ of the first junction box 10 could be coupled to the positive electrical wire 128$a$ of a third junction box 10 (not shown in the Figures). Accordingly, the junction box 10 may be used to electrically connect an array of solar panels in series or in parallel.

Referring to FIG. 5, once the connectors 126 are in place, the cover 16 is attached to the base 14. When the cover 16 is fully engaged with the base 14, each of the bosses 104 are forced against a corresponding one of the connectors 126, further compressing it and creating a spring tension thereon, which, in turn, pinches and retains the associated foil strip 122. As a result, a reliable physical and electrical connection between the foil strips 122 and the buss bars 106 is achieved.

The junction box 10 is typically attached to the flat underside of a solar panel, but it can be attached to other suitable surfaces (not shown in the Figures). With reference to FIG. 2, the groove 72 of the base 14 is sized and shaped to receive a sealant/adhesive, such as silicone or epoxy, so that the junction box 10 may be attached to the solar panel's underside (not shown in the Figures). For a rooftop mounted solar panel, the profile of the junction box 10 may be sufficiently thin enough to be mounted between the underside of the solar panel and a roof (not shown in the Figures).

When the junction box 10 is fully assembled and connected to the photovoltaic system, the current generated by the solar panel is transferred to the junction box 10 through the foil strips 122 and flows through the buss bars 106 and diodes 118. As indicated above, the electrical wires 128$a$, 128$b$ serve as the positive and negative connections and, in turn, may be connected electrically to either a DC/AC power inverter or to additional junction boxes 10 (not shown in the Figures).

Certain features of the junction box 10 described herein enable it to operate efficiently, while protecting it from harsh environmental conditions. For instance, the heat sink 112 dissipates heat from the interior of the housing 12, especially the heat generated by the diodes 118, to the external atmosphere by the fins 116. Since heat dissipation occurs external of the housing 12, the temperature of the interior of the housing 12 is kept at relatively low levels, and, therefore, the internal components of the junction box 10 are protected from damage by extreme heat. In addition, the vent 100 and filter 102 allow pressure and moisture laden air to pass outwardly from the interior of the housing 12 to the atmosphere, while only allowing air to pass from the atmosphere to the interior. As a result, pressure equilibrium within the housing 12 is maintained, thereby protecting the junction box 10 from damage caused by dangerous pressure levels. The filter 102 also prevents foreign particles from entering the housing 12.

The diodes 118 have bypass features, such that they will conduct electricity if an associated solar panel becomes reverse biased. For instance, if one solar panel in a series string fails, due to shade, broken cells, or other factors, it can produce so much resistance that all the other panels in that string are cut off. Moreover, the non-affected panels may deliver current through the effected panel, generating high power losses, and possibly creating hot spots and solar cell breakdown. Therefore, the diodes 118 create a path around the disabled solar panel and protects its from thermal destruction while other panels are exposed to full light.

Should the junction box 10 require repair or maintenance, the cover 16 is opened or removed by depressing the latch members 90$a$, 90$b$ and the latch members 92$a$, 92$b$ from their unlatched (i.e., unlocked) positions, which enables the cover 16 to pivot via the hook members 94$a$, 94$b$ on the posts 50$a$, 50$b$. The latch members 90$a$, 90$b$ and the latch members 92$a$, 92$b$ are preferably configured to be released with an appropriate tool, so as to prevent tampering of the junction box 10. When the cover 16 is opened or removed, the spring tension on the connectors 126 by the bosses 104 is relieved, and the connectors 126 may be easily and quickly disconnected. Because the connectors 126 have quick and easy connect and disconnect features, any potential damage to the solar panels by a user is minimized.

Figure 6:
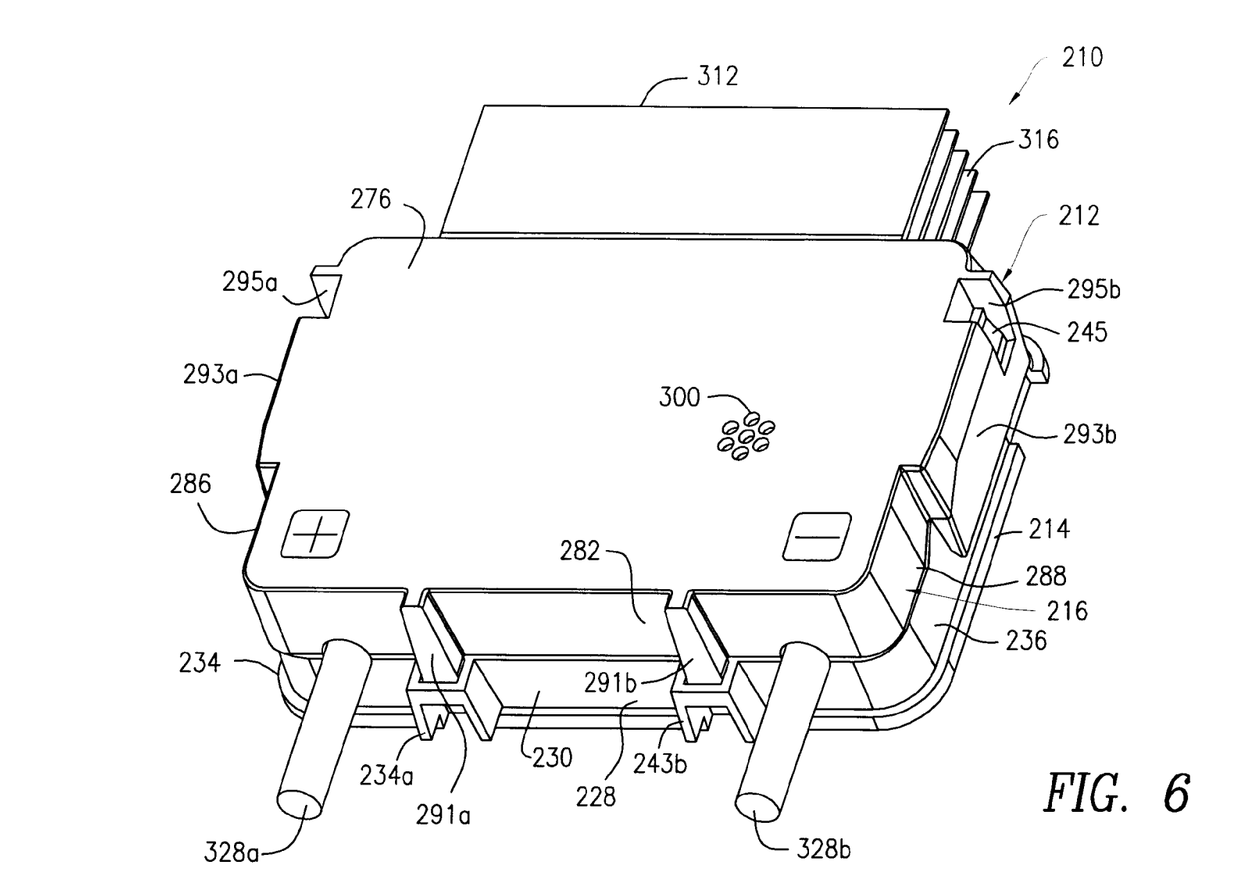
FIG. 6 is a top perspective view of a junction box constructed in accordance with another exemplary embodiment of the present invention.
Figure 7:
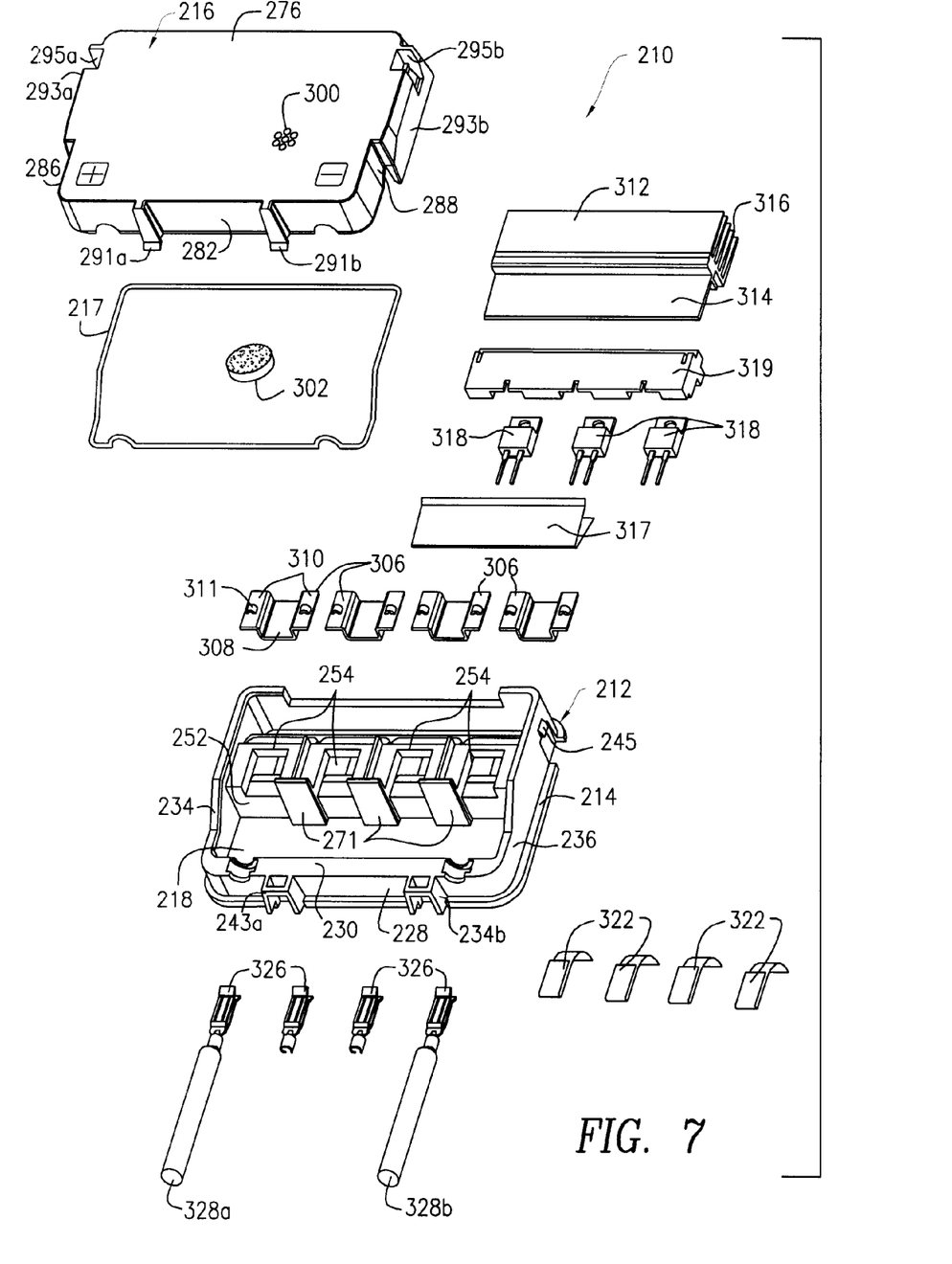
FIG. 7 is an exploded perspective view, looking from above, of the junction box shown in FIG. 6.
Figure 8:
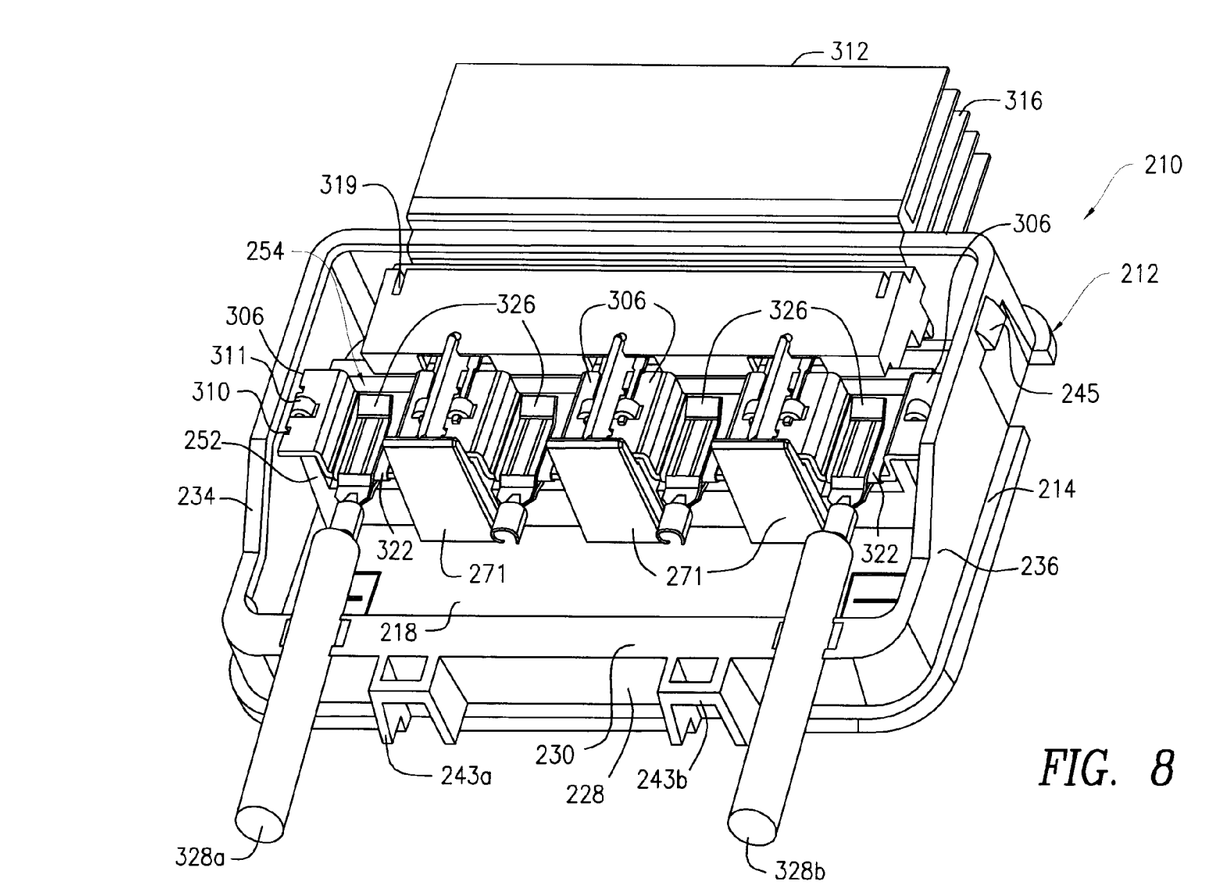
FIG. 8 is a top perspective view of the junction box shown in FIG. 6 with a cover employed by the junction box removed.

An alternate embodiment of a junction box constructed in accordance with the present invention is illustrated in FIGS. 6 through 8. To facilitate consideration and discussion, all elements, whether or not illustrated in FIGS. 6 through 8, which correspond to the elements described above with respect to FIGS. 1 through 5, have been designated by corresponding reference numerals increased by two hundred (200). New elements illustrated in FIGS. 6 through 8 which have no counterparts in FIGS. 1 through 5 are designated by odd reference numerals. The embodiment represented by FIGS. 6 through 8 is constructed and operates in the same manner as the junction box 10 shown in FIGS. 1 through 5, except as described below.

With reference to FIGS. 6 through 8, an electrical junction box 210 includes a rectangular-shaped housing 212 having a base 214 and a cover 216 attached removably to the base 214. The base 214 and the cover 216 are separate and distinct components, but they may be of unitary construction. A gasket 217 is positioned between the cover 216 and the base 214 to form a seal therebetween (see FIG. 7) from external environmental conditions, such as weather and foreign particles.

Referring to FIGS. 6 through 8, a front wall 230 of the base 214 includes a pair of locking receptacles 243$a$, 243$b$ extending outwardly from an exterior surface 228 thereof, while the exterior surfaces 228 of sidewalls 234, 236 include locking tabs 245 formed therein (the locking tab on the sidewall 234 is not fully shown in the Figures). The cover 216 includes a pair of latch members 291a, 291b that extend from a front wall 282 thereof. A pair of side wings 293a, 293b having associated latch members 295a, 295b that extend from respective sidewalls 286, 288 of the cover 216. When the cover 216 and the base 214 are fully engaged with one another, the latch members 291a, 291b of the cover 216 interlock with the locking receptacles 243a, 243b of the base 214, respectively, while the latch members 295a, 295b of the cover 216 interlock with the locking tabs 245 of the base 214. The side wings 293a, 293b of the cover 216 increase creepage and clearance for insulation purposes.

With reference to FIG. 7, a vent 300 is formed within the cover 216, extending from an exterior surface 276 to an interior surface opposite thereof. A filter 302 covers the vent 300 on the interior surface of the cover 216. The filter 302 may be made of GOR-TEX® material, but it can be made of other suitable materials known in the art.

Referring to FIGS. 7 and 8, the base 212 includes a plurality of walls 271 that extend upwardly from a floor 218 thereof. Each of the walls 271 is juxtaposed with a terminal block 252 and is positioned offset between a pair of adjacent receptacles 254. A plurality of buss bars 306, each having a central portion 308 and a pair of arms 310 extending laterally therefrom, are positioned within the receptacles 254. Each of the arms 310 of the bus bars 306 includes a lance tab 311 to retain it within its corresponding receptacle 254.

Still referring to FIGS. 7 and 8, the junction box 210 includes a heat sink 312 having a mounting portion 314 and a plurality of fins 316 extending therefrom and spaced apart from one another. A thermally conductive insulator 317 (as shown in FIG. 7) is inserted onto the mounting portion 314 of the heat sink 312, while a plurality of diodes 318 are mounted linearly to the mounting portion 314 of the heat sink 312 via the insulator 317. The insulator 317 is made from a silicon-based, thermally conductive insulation material, such as the Sil-Pad® 900S insulator material manufactured by The Bergquist Company. Alternatively, the insulator 317 can be made from other suitable thermally conductive insulation materials known in the art.

Still referring to FIGS. 7 and 8, a diode clip 319 is clipped on to the mounting portion 314 of the heat sink 312 and covers the diodes 318. The diode clip 319 maintains the position of the diodes 318, and spreads out heat generated by the diodes 318 more efficiently during use of the junction box 210. The diode clip 319 is made from an injection molded plastic, such as FORTRON® 6850 L6 polyphenylene sulfide (PPS) supplied by Ticona/Celanese Corporation. Alternatively, the diode clip 319 can be made from other suitable plastics or other materials known in the art.

Referring to FIGS. 7 and 8, the junction box 210 is adapted to receive one or more flexible foil strips 322 of a solar panel array (not shown in the Figures). The foil strips 322 are inserted within and connected to the junction box 210 in the same manner as that described above with respect to the junction box 10. Once the foil strips 322 are in position, low insertion female connectors 326 clip the foil strips 322 to the buss bars 306 to ensure a reliable physical and electrical connection between them. Each of the connectors 326 may include strength ribs for improved retention of the connection (not shown in the Figures). The connectors 326 are quickly and easily connected to and disconnected from to the buss bars 306. As shown in FIGS. 6 and 8, an electrical wire 328a is connected to one of the connectors 326, while an electrical wire 328b is connected to another one of the connectors 326. The remaining connectors 326 are utilized to maintain the physical and electrical connection between the associated foil strip 322 and the buss bar 306. The walls 271 separate and insulate the connectors 326 from one another. Once the connectors 326 are in place, the cover 216 is attached to the base 214. When the cover 216 is fully engaged with the base 214, bosses extending from the interior surface of the cover 216 (not shown in FIGS. 6 through 8) are forced against a corresponding one of the connectors 326, further compressing it and creating a spring tension thereon, which, in turn, pinches and retains the associated foil strip 322. As a result, a reliable physical and electrical connection between the foil strips 322 and the buss bars 306 is achieved.

Should the junction box 210 require repair or maintenance, the cover 216 is opened or removed by depressing the latch members 295a, 295b and the latch members 291a, 291b from their unlatched (i.e., unlocked) positions. The latch members 291a, 291b and the latch members 295a, 295b are preferably configured to be released with an appropriate tool, so as to prevent tampering of the junction box 210. When the cover 216 is opened or removed, the spring tension on the connectors 226 by the bosses (not shown) is relieved, and the connectors 226 may be easily and quickly disconnected.

It will be understood that the junction boxes 10, 210 described herein are merely exemplary and that a person skilled in the art may make many variations and modifications without departing from the full spirit and the scope of the embodiments described herein. For example, each of the junction boxes 10, 210 may include more or less than the four receptacles 54, 254, respectively, as shown in the Figures, in order to accommodate more or less than the four foil strips 122, 322. Moreover, the size and shape of the receptacles 54, 254 can be varied to accommodate foil strips having sizes and shapes different from those of the foil strips 122, 322. Also, as indicated above, each of the housings 12, 112 can consist of different shapes and sizes in order to fulfill the needs of custom applications.

In addition, while the junction box 10 includes the two latch members 90a, 90b, the two latch members 92a, 92b, the two tabs 42, and the two tabs 44, it can include more or less than two of each. Furthermore, the latch members 90a, 90b and the latch members 92a, 92b can consist of different designs that known in the art. Alternatively, the latch members 90a, 90b and the latch members 92a, 92b need not be included and the base 14 and the cover 16 may be attached to each other by other means known in the art (e.g., screws and other fasteners, adhesives, etc.). Similarly, while the junction box 210 includes the latch members 291a, 291b, the latch members 295a, 295b, the two tabs 245, and the two locking receptacles 243a, 243b, it can include more or less than two of each. Furthermore, the latch members 291a, 291b and the latch members 295a, 295b can consist of different designs that known in the art. Alternatively, the latch members 291a, 291b and the latch members 295a, 295b need not be included and the base 214 and the cover 216 may be attached to each other by other means known in the art (e.g., screws and other fasteners, adhesives, etc.).

Moreover, with respect to the junction box 10, the hook members 94a, 94b of the cover 16 and the posts 50a, 50b of the base 14 can be substituted or supplemented by other means for pivoting the cover 16 relative to the base 14, such as, for example, one or more living hinges (not shown in the Figures). Similarly, the junction box 210 may have similar means for pivoting the cover 216 relative to the base 214 (not shown in the Figures). Finally, each set of the diodes 118, 318 may be substituted by a single diode or other suitable electrical components known in the art. Accordingly, all such variations and modifications are intended to be included within the scope of the invention as defined in the appended claims.

We claim:

1. An electrical junction box, comprising a housing having an exterior surface, an interior portion, a plurality of receptacles positioned within said interior portion, and a plurality of guide channels extending from said exterior surface to said interior portion, each of said plurality of guide channels including an outer end located on said exterior surface of said housing and an inner end located within said interior portion of said housing in communication with a corresponding one of said plurality of receptacles, said inner and outer ends of each of said plurality of guide channels having different orientations, wherein each of said plurality of guide channels includes a first wall having a convex surface, and a second wall spaced from said first wall and having a concave surface, whereby one of a plurality of electrical conductors is extendable through a corresponding one of said plurality of guide channels in a non-linear fashion; further comprising a plurality of buss bars, each of said plurality of receptacles being sized and shaped to receive one of said plurality of buss bars, each of said plurality of buss bars being connectable to a corresponding one of the plurality of electrical conductors, wherein each of said plurality of receptacles includes a pair of shoulders and a floor recessed between said pair of shoulders, and each of said plurality of buss bars includes a central portion and a pair of arms extending laterally therefrom, said arms of one of said plurality of buss bars rest on said shoulders of a corresponding one of said plurality of receptacles such that said central portion of said one of said plurality of buss bars is seated above said floor of said corresponding one of said plurality of receptacles, wherein the plurality of electrical conductors includes a plurality of foil strips, one of the plurality of foil strips being directed between said flat portion of a corresponding one of said plurality of receptacles and said central portion of a corresponding one of said plurality of buss bars when the foil strip is received by said corresponding one of said plurality of receptacles, wherein said plurality of foil strips are adapted to be electrically connected to a photovoltaic system.

2. The electrical junction box of claim 1, wherein each of said plurality of guide channels includes guiding means, located between said inner and outer ends of said guide channel, for guiding the electrical conductor from a first direction to a second direction different from said first direction.

3. The electrical junction box of claim 2, wherein said first and second directions are substantially perpendicular to one another.

4. The electrical junction box of claim 1, further comprising first connecting means for electrically connecting said plurality of buss bars to one another.

5. The electrical junction box of claim 4, wherein said first connecting means includes at least one diode.

6. The electrical junction box of claim 5, wherein said at least one diode includes a plurality of diodes.

7. The electrical junction box of claim 6, further comprising a heat sink mounted to said housing, said heat sink including a mounting portion positioned within said interior portion of said housing and a plurality of fins extending from said mounting portion and protruding externally from said housing, and said plurality of diodes being mounted to said mounting portion of said heat sink.

8. The electrical junction box of claim 1, further comprising second connecting means for connecting each of the plurality of foil strips to a corresponding one of said plurality of buss bars.

9. The electrical junction box of claim 8, wherein said second connecting means includes a plurality of electrical connectors, each of the plurality of foil strips being connectable to a corresponding one of said plurality of buss bars by a corresponding one of said plurality of electrical connectors.

10. The electrical junction box of claim 9, wherein said plurality of electrical connectors includes a plurality of low insertion connectors.

11. The electrical junction box of claim 10, wherein said housing includes a base and a cover, said base including a first end and a second end opposite said first end, said cover being removably attached to said first end of said base, said outer ends of said plurality of guide channels being located at said second end of said base.

12. The electrical junction box of claim 11, wherein said cover includes an interior surface and a plurality of boss members extending from said interior surface of said cover, whereby when said cover is attached to said base, each of said plurality of boss members is urged against a corresponding one of said plurality of low insertion connectors to facilitate a mechanical and an electrical connection between a corresponding one of the plurality of foil strips and a corresponding one of said plurality of buss bars.

13. The electrical junction box of claim 12, wherein said cover includes at least one latch member and said base includes at least one lock tab, said at least one latch member and said at least one lock tab being sized and shaped such that they are releasably engageable with one another.

14. The electrical junction box of claim 10, wherein one of said plurality of low insertion connectors is electrically connected to an external device, and another of said plurality of low insertion connectors is electrically connected to the external device.

* * * * *